US009203368B2

United States Patent
Miyashita et al.

(10) Patent No.: US 9,203,368 B2
(45) Date of Patent: Dec. 1, 2015

(54) POWER AMPLIFIER

(71) Applicant: Mitsubishi Electric Corporation, Tokyo (JP)

(72) Inventors: Miyo Miyashita, Tokyo (JP); Yoshinori Takahashi, Tokyo (JP); Kazuya Yamamoto, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/259,209

(22) Filed: Apr. 23, 2014

(65) Prior Publication Data
US 2015/0054583 A1 Feb. 26, 2015

(30) Foreign Application Priority Data
Aug. 21, 2013 (JP) .................. 2013-170973

(51) Int. Cl.
H03G 3/00 (2006.01)
H03F 1/02 (2006.01)
H03F 1/22 (2006.01)
H03F 1/32 (2006.01)
H03F 3/193 (2006.01)
H03F 1/30 (2006.01)

(52) U.S. Cl.
CPC .............. *H03G 3/00* (2013.01); *H03F 1/0266* (2013.01); *H03F 1/223* (2013.01); *H03F 1/3205* (2013.01); *H03F 3/193* (2013.01); H03F 1/30 (2013.01); H03F 1/302 (2013.01); H03F 2200/18 (2013.01); H03F 2200/447 (2013.01)

(58) Field of Classification Search
CPC .............. H03F 2200/451; H03F 3/245; H03F 2200/447; H03F 3/72; H03F 1/302; H03F 2200/18; H03F 2203/7215; H03F 3/195; H03F 1/301; H03F 3/19; H03F 3/187; H03F 3/4508; H03F 3/45179; H03F 2200/294; H03F 1/30; H03F 3/343; H03F 3/345; H03F 3/347; H03F 1/0261; G05F 3/265; G05F 3/262
USPC ........................................ 330/289, 296, 311
See application file for complete search history.

(56) References Cited

U.S. PATENT DOCUMENTS

| 4,477,782 A | * | 10/1984 | Swanson ....................... 330/288 |
| 7,088,187 B1 | * | 8/2006 | Jin et al. ....................... 330/311 |
| 7,397,309 B2 | * | 7/2008 | Tanoi ............................ 330/311 |
| 7,629,851 B2 | * | 12/2009 | Tsurumaki et al. ........... 330/311 |
| 8,581,666 B2 | * | 11/2013 | Ogasawara ................... 330/296 |

FOREIGN PATENT DOCUMENTS

JP 2013-98904 A 5/2013

OTHER PUBLICATIONS

Korean Patent Office; Korean Office Action in Korean Patent Application No. 10-2014-0096962 (Aug. 27, 2015).

* cited by examiner

*Primary Examiner* — Khanh V Nguyen
(74) *Attorney, Agent, or Firm* — Leydig, Voit & Mayer, Ltd.

(57) ABSTRACT

A power amplifier includes: a first transistor having a gate, a drain, and a source that is grounded; a second transistor having a gate, a drain, and a source that is connected to the drain of the first transistor; a capacitor connected between the gate of the second transistor and a grounding point; an idling current control circuit having a positive temperature coefficient and making an idling current flowing through the first transistor proportional to an ambient temperature; and a drain voltage control circuit having a positive temperature coefficient and making a drain voltage on the first transistor proportional to the ambient temperature.

7 Claims, 12 Drawing Sheets

POWER AMPLIFIER

BACKGROUND OF THE INVENTION

1. Field of the Invention

The present invention relates to a power amplifier mainly for use in a device for mobile communication such as a portable telephone set and, more particularly, to a power amplifier capable of limiting a temperature dependence of the power gain at a specified power as well as a small-signal gain deviation.

2. Background Art

A power amplifier for mobile communication amplifies modulated waves output from a radiofrequency integrated circuit (RFIC) in a wireless band to a transmitted power value necessary for transmission from an antenna to a base station, a terminal or repeater. A maximum output voltage required of a power amplifier is specified for each mobile communication. A power amplification factor required of a power amplifier is a value sufficient for outputting the maximum output power of the power amplifier according to the maximum output power of an RFIC, and a minimum value of the power amplification factor is set by considering a loss due to a filter, an isolator or the like for spurious removal inserted between the output of the power amplifier and an antenna. On the other hand, there is a need to set the maximum output power of the power amplifier so that the levels of noise and spurious signals output from the power amplifier are not higher than a certain level.

Further, a high power efficiency and high linearity are required of a power amplifier. In ordinary cases, in order to increase the power efficiency of a power amplifier, the power amplifier is designed so that the maximum transmission power is closer to the saturation region of the power amplifier. However, the gain of the amplifier is reduced by a reduction in amplitude due to non-linearity in the vicinity of the saturation region. A distortion is simultaneously caused in the output signal due to the non-linearity. This becomes a cause of deterioration in adjacent channel leakage ratio (ACLR) and interference with other systems. Therefore, improving the linearity is of primary importance. The distortion can also be expressed by the amplitude input-output characteristic (AM-AM characteristic) of the power amplifier and the change in phase of the output signal (AM-PM characteristic). The power amplifier is designed so that each of the changes in characteristics is equal to or lower than a certain level in an output level region assumed with respect to the power amplifier.

In recent years, with the improvement in multifunctionality and the reduction in price of portable telephone sets, there has been a more and more increasing demand for reducing the manufacturing cost of power amplifiers for use in portable telephone sets. The development of power amplifiers using a CMOS process has become more active as a means for reducing the manufacturing cost.

With a power amplifier using a cascode amplifier, there is a problem that a change in power gain ($\Delta Gp$) at a specified output when the ambient temperature is changed is larger than that in a power amplifier using a source-grounded amplifier (see, for example, Japanese Patent Laid-Open No. 2013-98904). As a technique to limit a change in small-signal gain ($\Delta Gl$), adjustment of the bias point of a source-grounded transistor (idling current) with respect to a change in temperature is ordinarily performed.

SUMMARY OF THE INVENTION

In the conventional power amplifier using a cascode amplifier, the power gain at a specified output is determined by the extent of the IV plane and a load line. Therefore, in a case where a temperature compensation is made by means of the idling current only, a change in the IV plane with respect to a change in temperature cannot be limited while a small signal gain deviation ($\Delta Gl$) can be limited. Since the contribution to the power gain ($\Delta Gp$) at the specified power is small, there is a problem that the change in gain (AM-AM) with respect to the output power is large and the distortion characteristic degrades.

In view of the above-described problems, an object of the present invention is to provide a power amplifier capable of limiting a temperature dependence of the power gain at a specified power as well as a small-signal gain deviation.

According to the present invention, a power amplifier includes: a first transistor having a gate, a drain and a source that is grounded; a second transistor having a gate, a drain and a source that is connected to the drain of the first transistor; a capacitor connected between the gate of the second transistor and a grounding point; an idling current control circuit having a positive temperature gradient and making an idling current through the first transistor proportional to an ambient temperature; and a drain voltage control circuit having a positive temperature gradient and making a drain voltage on the first transistor proportional to the ambient temperature.

The present invention makes it possible to limit a temperature dependence of the power gain at a specified power as well as a small-signal gain deviation.

Other and further objects, features and advantages of the invention will appear more fully from the following description.

DETAILED DESCRIPTION OF THE PREFERRED EMBODIMENTS

A power amplifier according to the embodiments of the present invention will be described with reference to the drawings. The same components will be denoted by the same symbols, and the repeated description thereof may be omitted.

First Embodiment

Figure 1:
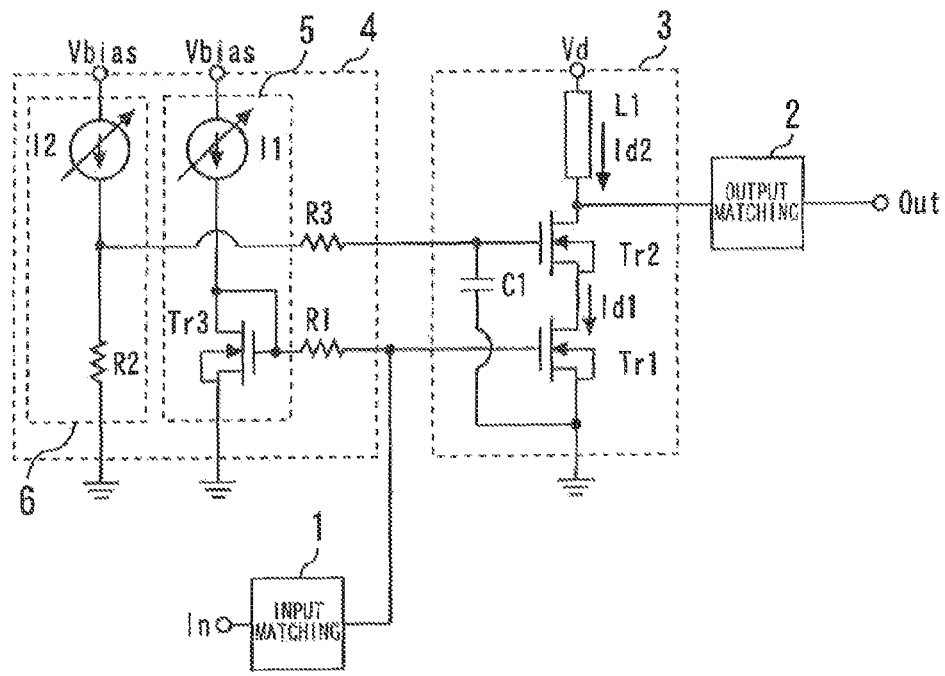
FIG. 1 is a circuit diagram showing a power amplifier according to a first embodiment of the present invention.

FIG. 1 is a circuit diagram showing a power amplifier according to a first embodiment of the present invention. A transistor Tr1 forms a source-grounded amplifier having its source grounded. The source of a transistor Tr2 is connected to the drain of Tr1. A capacitor C1 is connected between the gate of Tr2 and a grounding point. Tr2 forms a gate-grounded amplifier having its gate RF-grounded through the capacitor C1.

An RF signal is input from an input terminal In through an input matching circuit 1 to be applied to the gate of Tr1, and Tr1 outputs the RF signal from the drain. The drain of Tr2 is connected to a power supply terminal Vd through an inductor L1. The inductor L1 is a line having a certain electrical length. To Tr2, the output signal from Tr1 is input through the source. Tr2 outputs the RF signal from its drain to an output terminal Out through an output matching circuit 2.

Tr1 and Tr2 cascode-connected in this way form a cascode amplifier 3. In the power amplifier having this cascode configuration, a drain current at a 1 dB gain compression point is twice or more the drain current flowing at ordinary temperature when no signal is input. Tr1 and Tr2 are n-channel NMOS transistors integrated by using a CMOS process.

A bias circuit 4 supplies biases to the gates of Tr1 and Tr2. In the bias circuit 4, a transistor Tr3 is a reference element for setting a Tr1 bias current. The source of Tr3 is grounded and the gate and the drain of Tr3 are connected to the gate of Tr1 through a resistor R1 having a large resistance value. Tr1 and Tr3 form a current mirror circuit. The resistor R1 is inserted between the output of the input matching circuit 1 and the gate of Tr3 to avoid the influence of the RF signal from the input matching circuit 1 on the bias circuit 4.

A current source I1 having a positive temperature gradient is connected to a power supply terminal Vbias and supplies a current proportional to the ambient temperature to the gate and the drain of Tr3. That is, if I1 represents the current supplied from the current source I1; T represents the ambient temperature; and $\alpha 1$ is a constant, $I1 = \alpha 1 * T$. A gate voltage is generated on Tr1 according to the current flowing from the current source I1 into Tr3, and a current $Id1 (\approx I1*Wg1/Wg3)$ roughly determined by the ratio of the gate width Wg1 of Tr1 and the gate width Wg3 of Tr3 flows through Tr1. Thus, an idling current control circuit 5 formed by Tr3 and the current source I1 has a positive temperature gradient and makes the idling current through Tr1 proportional to the ambient temperature.

Also, in the bias circuit 4, a current source I2 having a positive temperature gradient is connected to a power supply terminal Vbias and outputs a current proportional to the ambient temperature. If I2 represents the current supplied from the current source I2; T represents the ambient temperature; and $\alpha 2$ is a constant, $I2 = \alpha 2 * T$.

The current source I2 is grounded through a resistor R2. If the resistance value of the resistor R2 is R2, a voltage shown by $I2*R2 = \alpha 2*T*R2$ is supplied to the gate of Tr2 through a high-resistance resistor R3. The high-resistance resistor R3 is provided for the purpose of limiting an inflow of the RF signal into the bias circuit.

The output matching circuit 2 is formed with constants such that no direct current flows therethrough. Therefore, a current Id2=Id1 flows through Tr2. A gate-source voltage Vgs2 between the gate and source of Tr2 is determined by Id2. If the gate voltage on Tr2 is Vg2, the drain voltage Vd1 on Tr1 is set to Vd1=Vg2−Vgs. Thus, a drain voltage control circuit 6 formed by the current source I2 and the resistor R2 has a positive temperature gradient and supplies a voltage proportional to the ambient temperature to the gate of Tr2, thereby making the drain voltage on Tr1 proportional to the ambient temperature.

Figure 2:
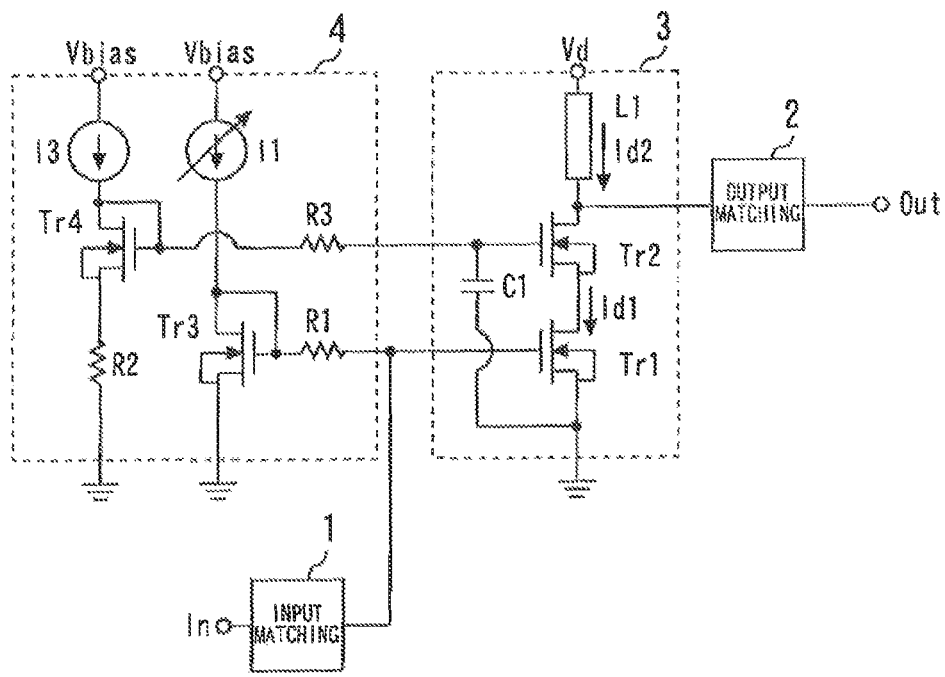
FIG. 2 is a circuit diagram showing a power amplifier according to a comparative example.

The advantages of the present embodiment will be described in comparison with a comparative example. FIG. 2 is a circuit diagram showing a power amplifier according to a comparative example. In the comparative example, a transistor Tr4 and a current source I3 are provided in place of the current source I2 in the first embodiment. Tr4 is a reference element for setting a gate voltage on Tr2. The source of Tr4 is grounded through a resistor R2 and the gate and the drain of Tr4 are connected to the gate of Tr2 through a high-resistance resistor R3. The current source I3 supplies a current to the gate and the drain of Tr4. This current source I3 has no temperature dependence.

A gate-source voltage Vgs4 is generated according to the current caused by the current source I2 to flow through Tr4 from the drain. If the current output from the current source I3 is I3, a voltage shown by Vg4=Vgs4+I3*R2 is generated on the gate of Tr4. Since no current flows through the gate of the MOSFET, a voltage shown by Vg2=Vg4 is applied to the gate of Tr2 through the high-resistance resistor R3.

Figure 3A:
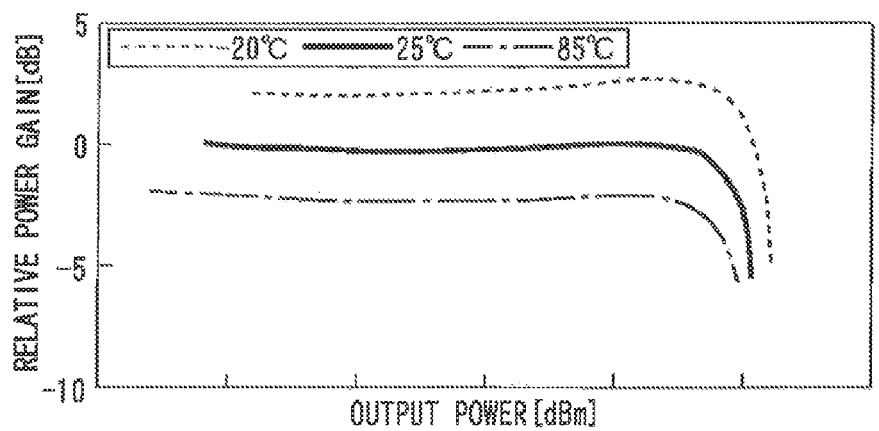
FIGS. 3A and 4A are diagrams showing the relationships between the output power and the relative power gain of the power amplifier according to the comparative example.
Figure 3B:
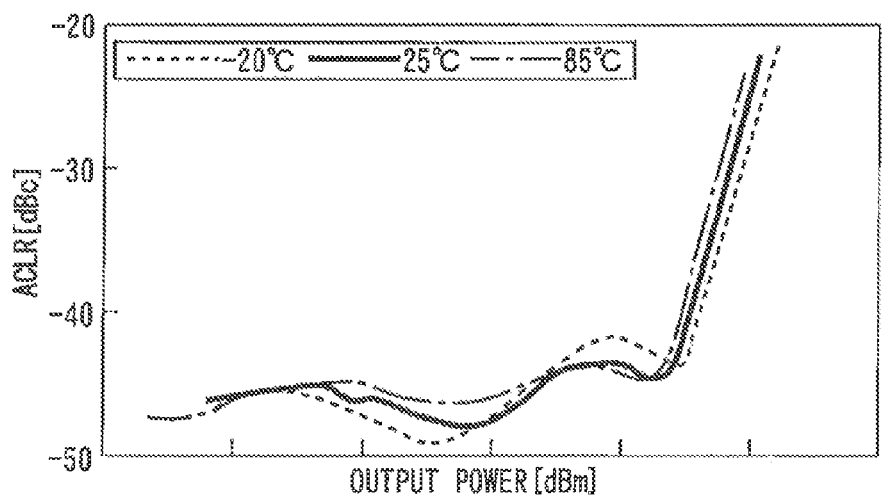
FIGS. 3B and 4B are diagrams showing the relationships between the output power and the adjacent channel leakage power of the power amplifier according to the comparative example.
Figure 4A:
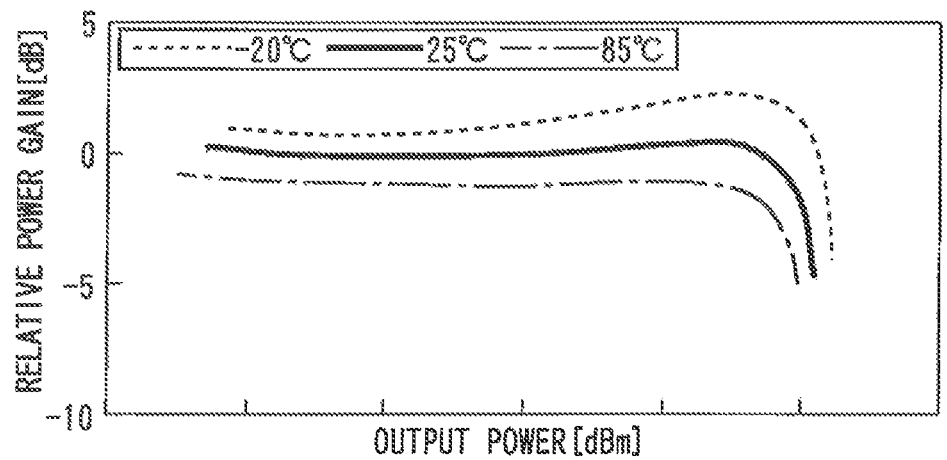
Figure 4B:
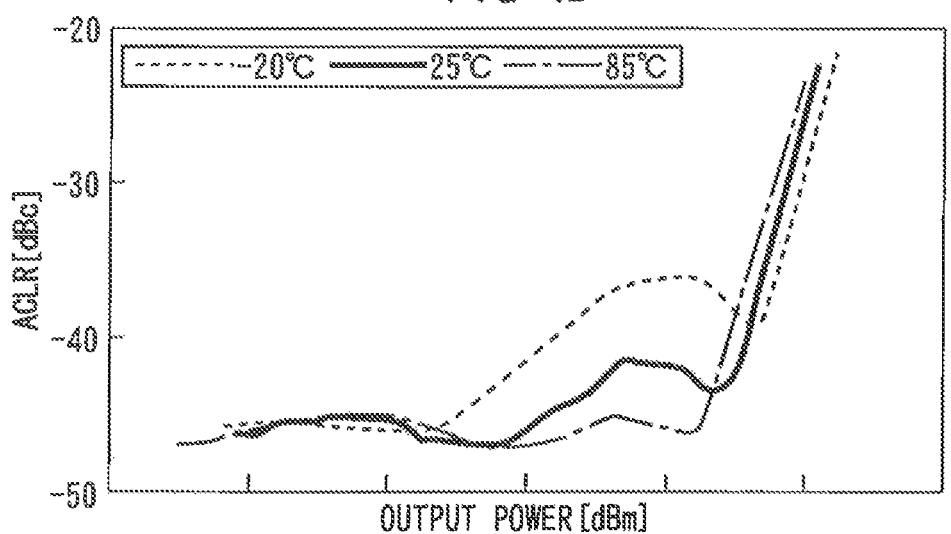

FIGS. 3A and 4A are diagrams showing the relationships between the output power and the relative power gain of the power amplifier according to the comparative example. FIGS. 3B and 4B are diagrams showing the relationships between the output power and the adjacent channel leakage power of the power amplifier according to the comparative example. FIGS. 3A and 3B show the relationships when no temperature compensation is made. FIG. 3A shows the relative power gain with respect to the output power (with reference to a small-signal gain at an ambient temperature of 25° C.), and FIG. 3B shows the adjacent channel leakage power (ACLR) obtained at the same time. The change in gain (ΔGp) with respect to a temperature range from −20 to 85° C. is about 5 dB, which is about twice that in the case of a power amplifier constituted by a GaAs HBT or the like. On the other hand, in the ACLR, distortion degradation is determined by gain suppression in the vicinity of the saturation of the power amplifier, since the gain deviation at the same temperature is small except in the vicinity of the saturation.

FIGS. 4A and 4B show the relationships when an idling current temperature compensation is made by imparting a positive temperature gradient to the current source I1. As shown in FIG. 4A, the change in gain (ΔGp) with respect to a temperature range from −20 to 85° C. is limited to 2 dB or less at a low signal level. However, a difference in gain of about 4 dB still remains in the vicinity of the saturation. The gain deviation at −20° C. for example increases gradually from when the power is low or medium. Accordingly, the ACLR worsens abruptly at that output power.

Figure 5A:
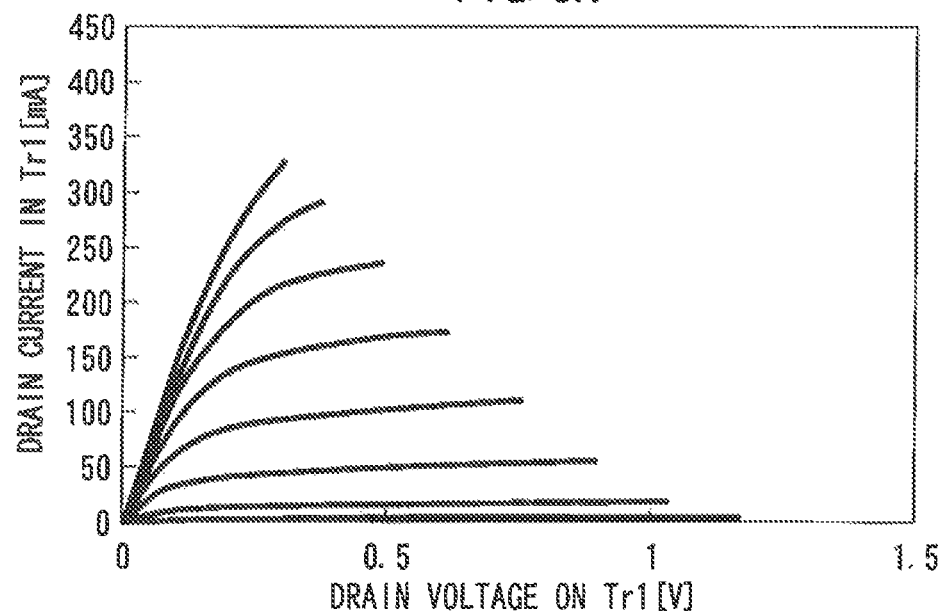
FIGS. 5A and 6A are diagrams showing the IV characteristics of the cascode amplifier in the power amplifier according to the comparative example when an idle current temperature compensation is made.
Figure 5B:
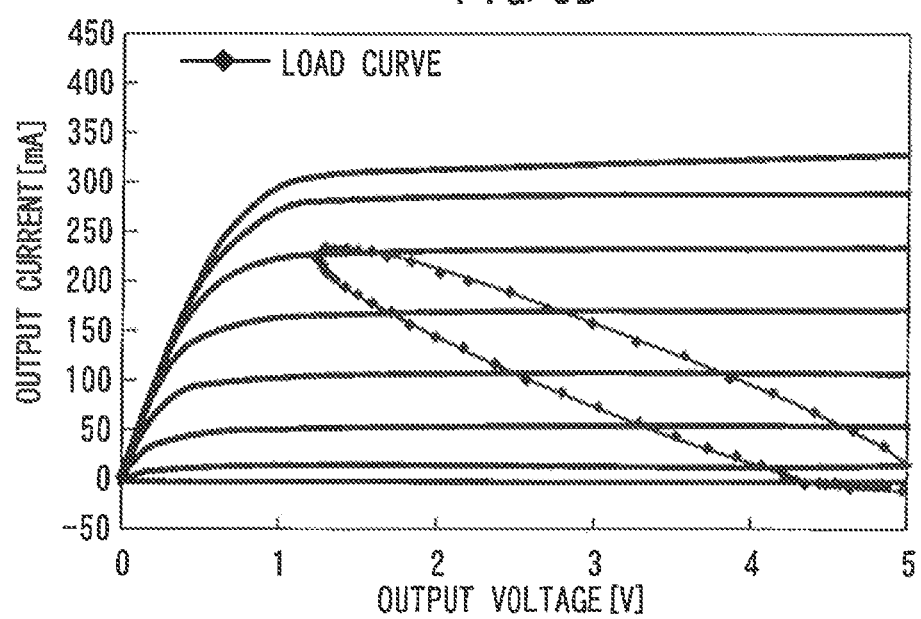
FIGS. 5B and 6B are diagrams showing a load curve of the power amplifier according to the comparative example at a specified power.
Figure 6A:
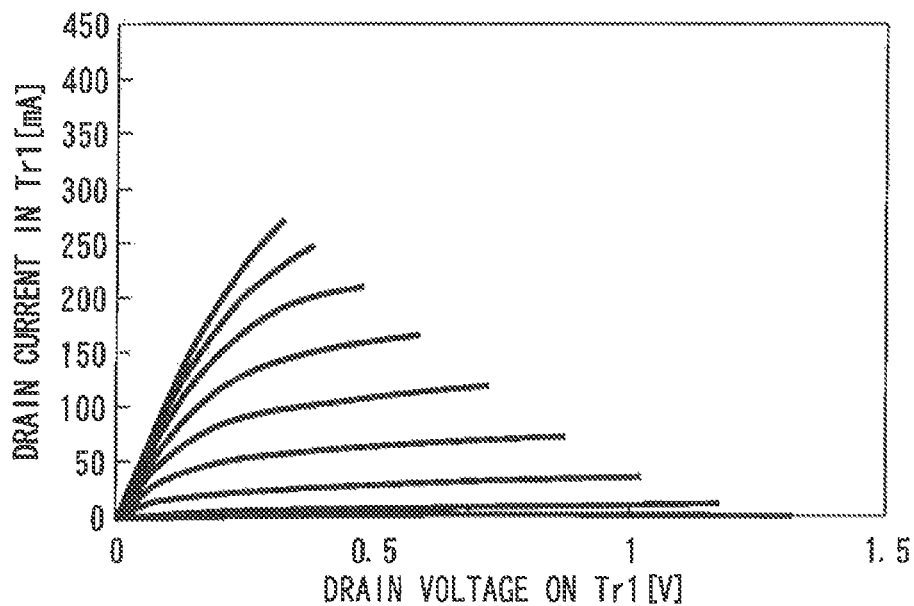
Figure 6B:
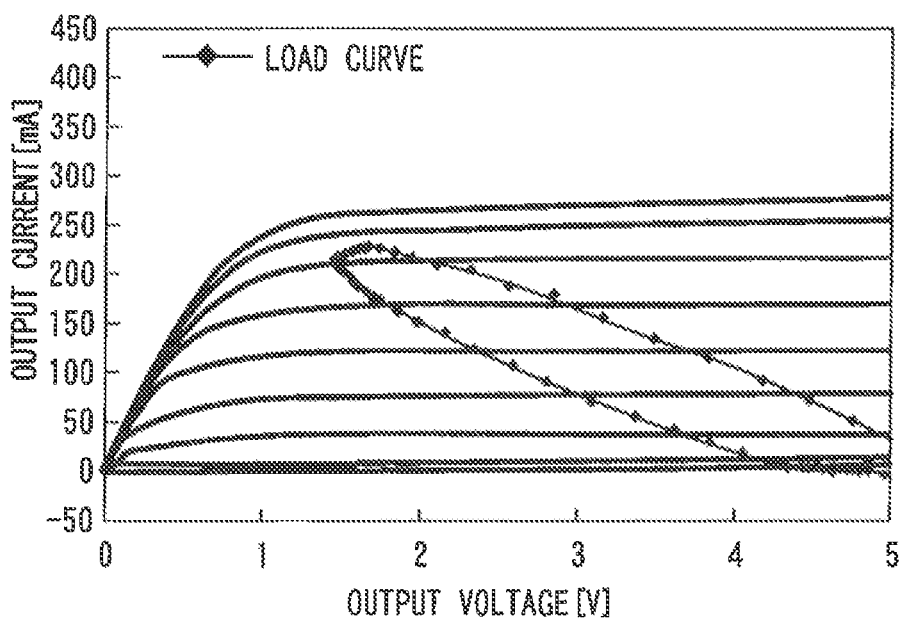

FIGS. 5A and 6A are diagrams showing the IV characteristics of the cascode amplifier in the power amplifier according to the comparative example when an idle current temperature compensation is made. FIGS. 5B and 6B are diagrams showing a load curve of the power amplifier according to the comparative example at a specified power. FIGS. 5A and 5B show the characteristics when the ambient temperature is −20° C. FIG. 5A shows the IV characteristic of Tr1, and FIG. 5B shows the IV characteristic of the entire cascode amplifier. As described above, the output current from the cascode amplifier is equal to the drain current in Tr1, and the drain current in Tr1 is limited by the drain voltage Vd1, which is the result of subtraction of the Tr2 gate-source voltage Vgs2 from the Tr2 gate voltage Vg2. FIGS. 6A and 6B show the characteristics when the ambient temperature is 85° C. When the temperature is as high as this, the IV plane is made narrower with respect to the drain current in Tr1 by a reduction in gm or the like in a temperature characteristic of Tr1, which influences the load curve at the specified power, even though the idling current is adjusted by the bias circuit having a positive temperature gradient.

Figure 7A:
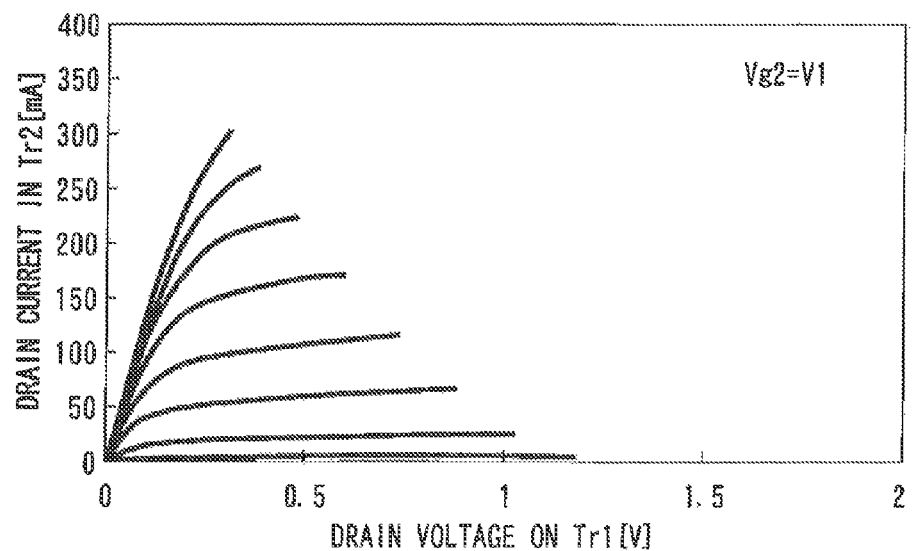
FIGS. 7A and 7B are diagrams showing the relationship between the voltage on the gate-grounded transistor and the drain voltage on the source-grounded transistor and the drain current in the source-grounded transistor in the first embodiment of the present invention.
Figure 7B:
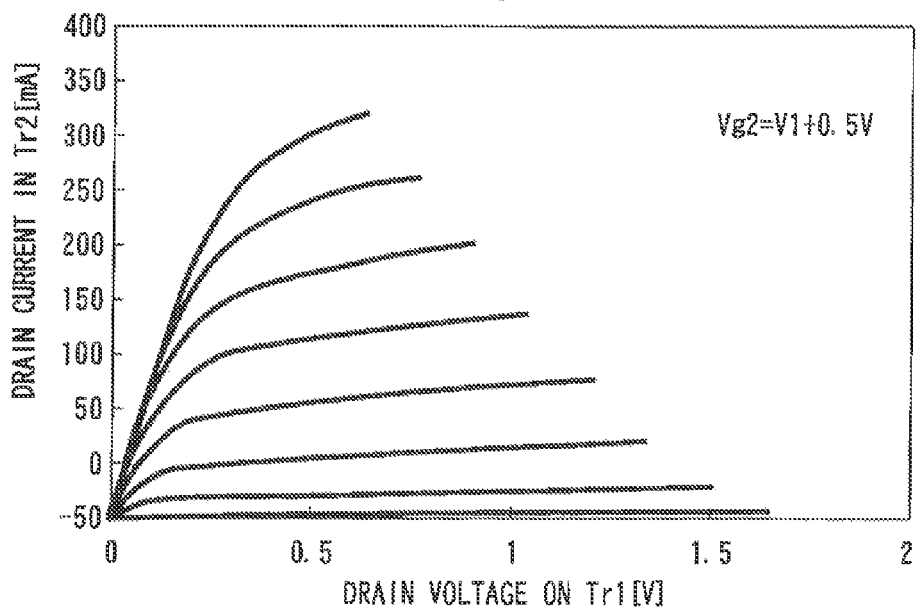
Figure 8A:
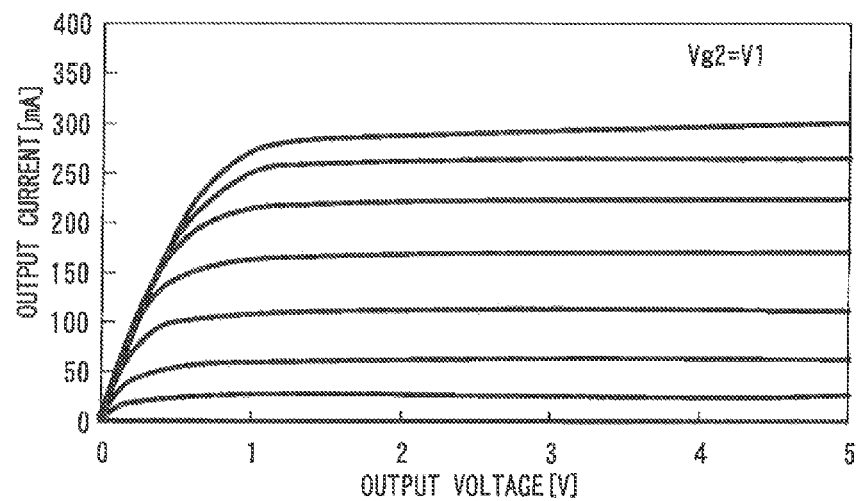
FIGS. 8A and 8B are diagrams showing the relationship between the output voltage and the output current of the power amplifier according to the first embodiment of the present invention.
Figure 8B:
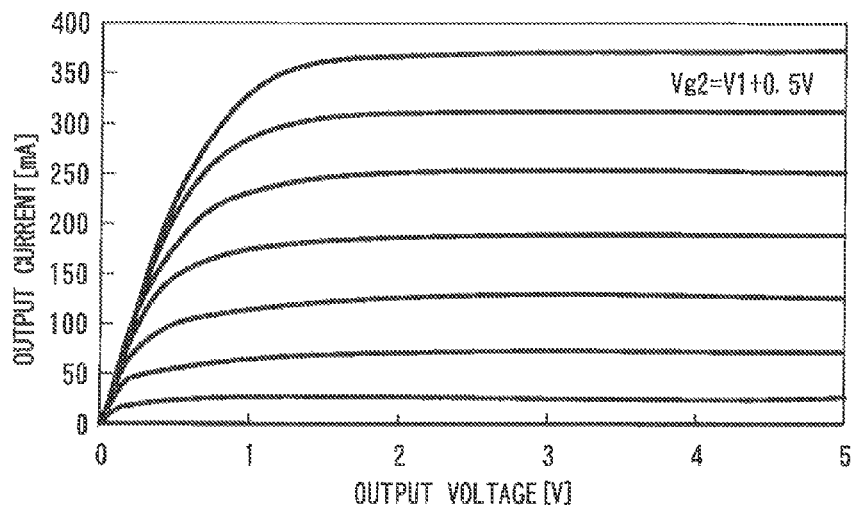

FIGS. 7A and 7B are diagrams showing the relationship between the voltage on the gate-grounded transistor and the drain voltage on the source-grounded transistor and the drain current in the source-grounded transistor in the first embodiment of the present invention. FIGS. 8A and 8B are diagrams showing the relationship between the output voltage and the output current of the power amplifier according to the first embodiment of the present invention.

By increasing Vg2 on Tr2, the drain voltage Vd1 on IV characteristic of Tr1 is increased. The IV plane of the cascode amplifier 3 is broadened thereby. Thus, the extent of the IV plane can be changed by controlling Vd1.

Figure 9A:
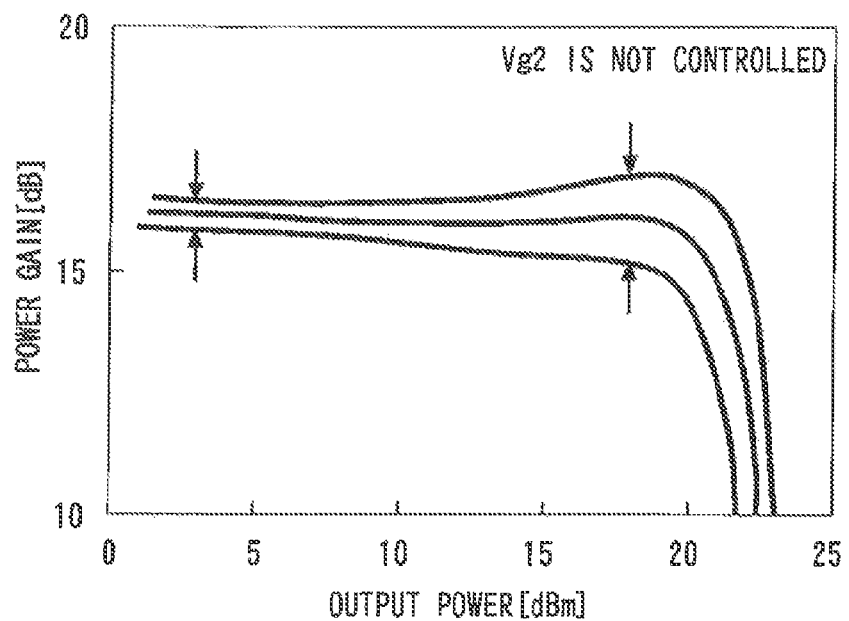
FIGS. 9A and 9B are diagrams showing the relationship between the output power and the power gain of the power amplifier according to the first embodiment of the present invention.
Figure 9B:
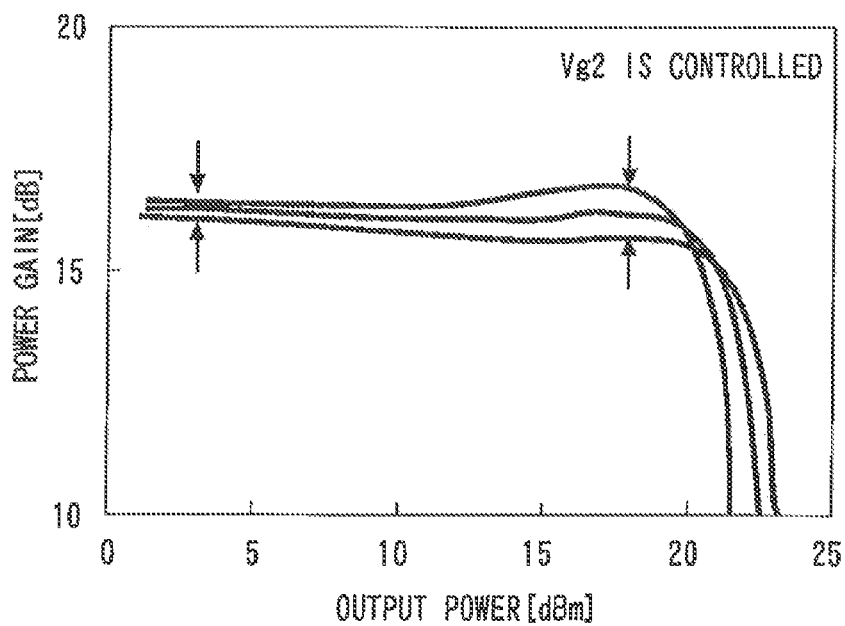

FIGS. 9A and 9B are diagrams showing the relationship between the output power and the power gain of the power amplifier according to the first embodiment of the present invention. The deviation of the power gain at a specified power shown in FIG. 9B is reduced relative to that shown in FIG. 9A, which is observed when the gate voltage Vg2 on the gate-grounded transistor is not controlled. Thus, in the present embodiment, not only a small-signal gain deviation but also a temperature dependence of the power gain at a specified power can be reduced.

Second Embodiment

Figure 10:
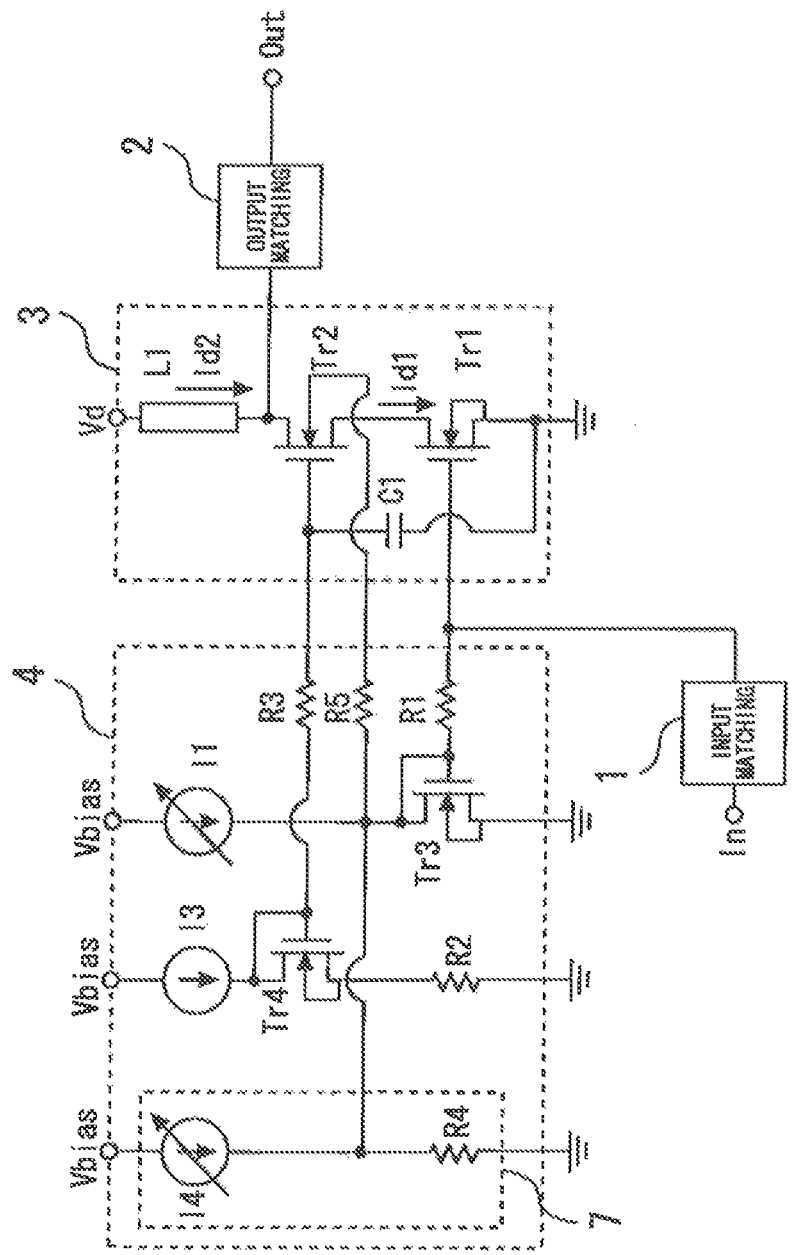
FIG. 10 is a circuit diagram showing a power amplifier according to a second embodiment of the present invention.

FIG. 10 is a circuit diagram showing a power amplifier according to a second embodiment of the present invention. The bias circuit 4 in this power amplifier differs from that in the comparative example shown in FIG. 2 in that a current source I4 and resistors R4 and R5 are added to the bias circuit 4. The current source I4 having a positive temperature gradient is connected to a power supply terminal Vbias and outputs a current proportional to the ambient temperature. That is, if I4 represents the current supplied from the current source I4; T represents the ambient temperature; and α3 is a constant, I4=α3*T.

The current source I4 is grounded through the resistor R4. If I4 represents the output current from the current source I4 and R4 represents the resistance value of the resistor R4, a voltage expressed by I4*R4=α3*T*R4 is supplied to a body terminal (substrate) of Tr2 through the high-resistance resistor R5. The high-resistance resistor R5 is provided for the purpose of limiting an inflow of the RF signal into the bias circuit.

The source voltage on Tr2 is determined by the bias circuit formed by the current source I2, Tr4 and R3. A drain voltage control circuit 7 formed by the current source I4 and the resistor R4 supplies a body voltage (substrate voltage) proportional to the ambient temperature to the substrate of Tr2, thereby changing the threshold voltage Vth of Tr2 according to the ambient temperature. As a result, the drain voltage on Tr1 is made proportional to the ambient temperature.

In the characteristics of Tr2, gmb changes. When the body voltage is increased with an increase in temperature, gmb is increased and the gain becomes higher. When the body voltage is reduced with a reduction in temperature, gmb is reduced and the gain becomes lower. Thus, the control of the body voltage with respect to temperature simultaneously enables reducing the variation in small-signal gain with temperature.

Figure 11A:
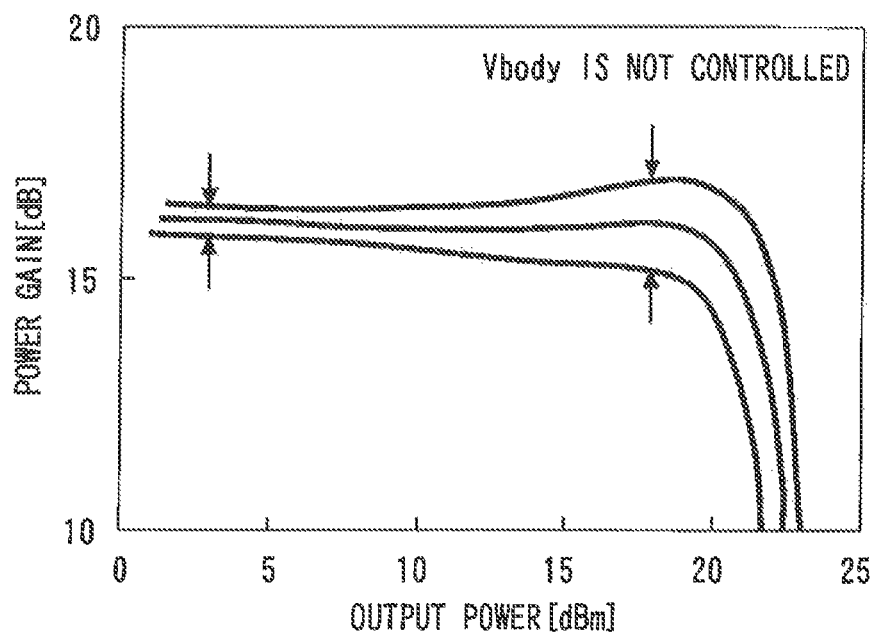
FIGS. 11A and 11B show the relationship between the output power and the power gain of the power amplifier according to the second embodiment of the present invention.
Figure 11B:
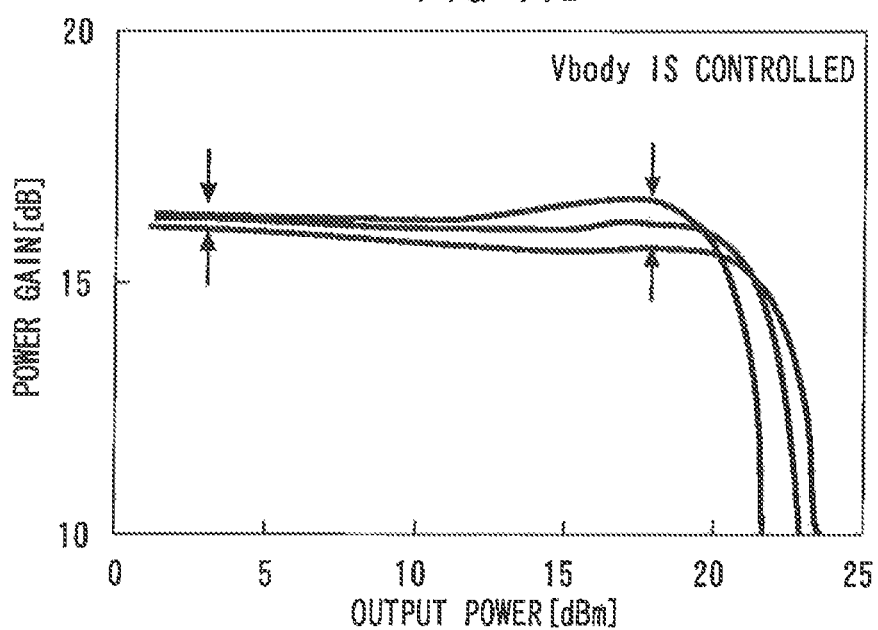

FIGS. 11A and 11B show the relationship between the output power and the power gain of the power amplifier according to the second embodiment of the present invention. FIG. 11A shows the relationship when control of Vd1 through control of the body voltage Vbody of the gate-grounded transistor Tr2 is not performed. FIG. 11B shows the relationship when control of the body voltage Vbody is performed. The power gain deviation at a specified power shown in FIG. 11B is reduced relative to that shown in FIG. 11A. Also, a small-signal gain deviation shown in FIG. 11B is smaller than that shown in FIG. 11A.

Thus, the temperature characteristic at a specified power and the temperature characteristic under a small signal condition can be simultaneously compensated by controlling the body voltage Vbody. Accordingly, the range of control of the idling current in the current mirror circuit formed by the current source I1, Tr3 and Tr1 can be reduced, so that the current control function based on the current source I1 can be eliminated.

In the first and second embodiments, several practical combinations of transistors for the cascode amplifier 3 according to the power supply voltage and the output power are conceivable. For example, in the case of a power amplifier for use on a portable telephone set having a power supply voltage of 3.2 to 4.2 V and an output on the order of 1 W, a transistor having a withstand voltage of 1.3 to 2 V is used as source-grounded transistor Tr1, and a transistor having a withstand voltage of 3.3 to 5 V is used as gate-grounded transistor Tr2. The amplifiers in the first and second embodiments can operate particularly effectively when the withstand voltage of the source-grounded transistor Tr1 is 1.3 to 2 V.

Third Embodiment

Figure 12:
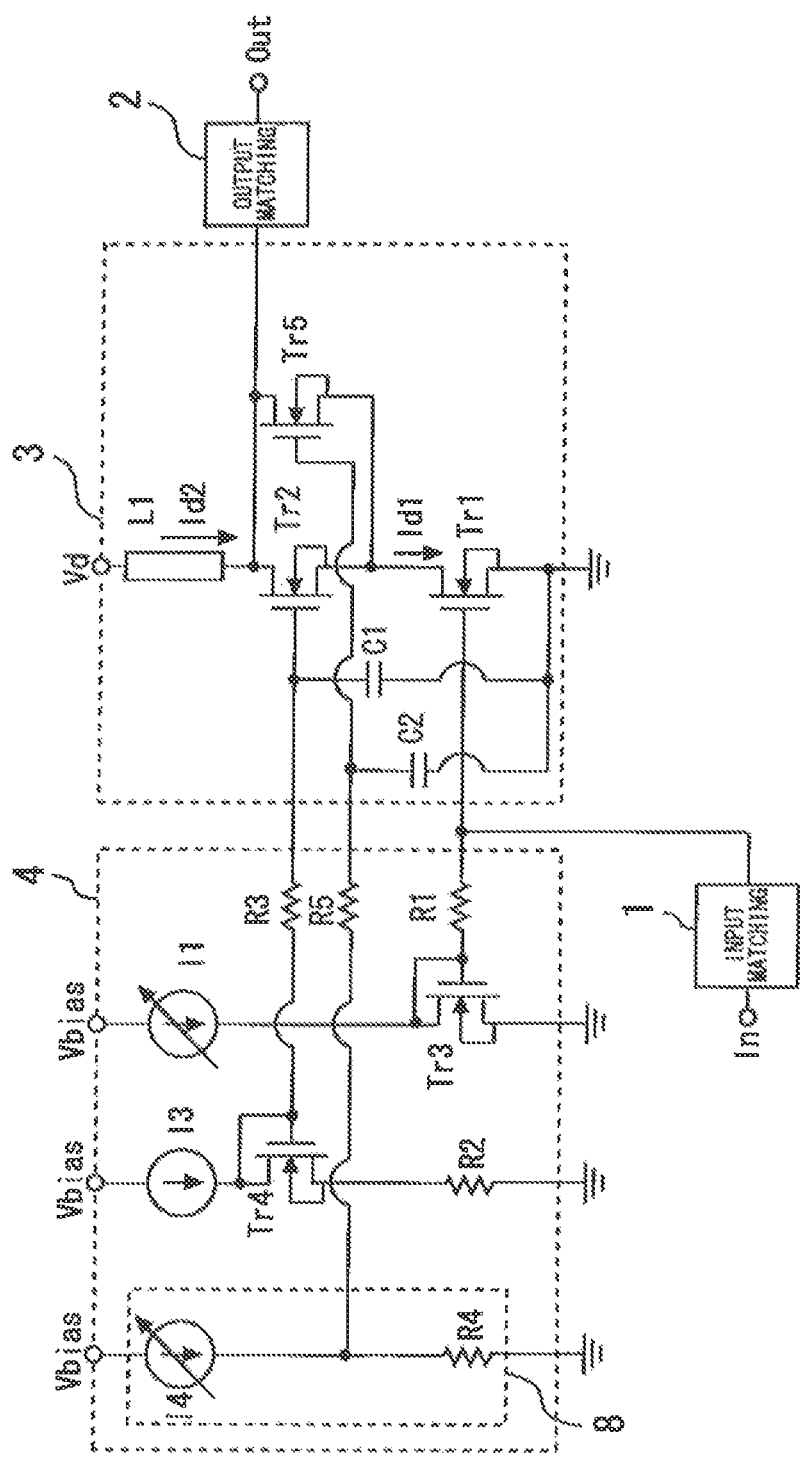
FIG. 12 is a circuit diagram showing a power amplifier according to a third embodiment of the present invention.

FIG. 12 is a circuit diagram showing a power amplifier according to a third embodiment of the present invention. The cascode amplifier 3 in this power amplifier differs from that in the comparative example shown in FIG. 2 in that a transistor Tr5 is provided by being connected in parallel with Tr2. The source of Tr5 is connected to the drain of Tr1, and the drain of Tr5 is connected to the drain of Tr2. Also, a current source I4 and resistors R4 and R5 are added to the bias circuit 4, as in the case of the second embodiment.

A voltage shown by I4*R4 is supplied to the gate of Tr5 through the high-resistance resistor R5. That is, a drain voltage control circuit 8 formed by the current source I4 and the resistor R4 supplies a voltage proportional to the ambient temperature to the gate of Tr5. More specifically, if I4 represents the output current from the current source I4 and R4 represents the resistance value of the resistor R4, a voltage expressed by I4*R4=α3*T*R4 is supplied to the gate of Tr5. The drain voltage on Tr1 is thereby made proportional to the ambient temperature.

Figure 13A:
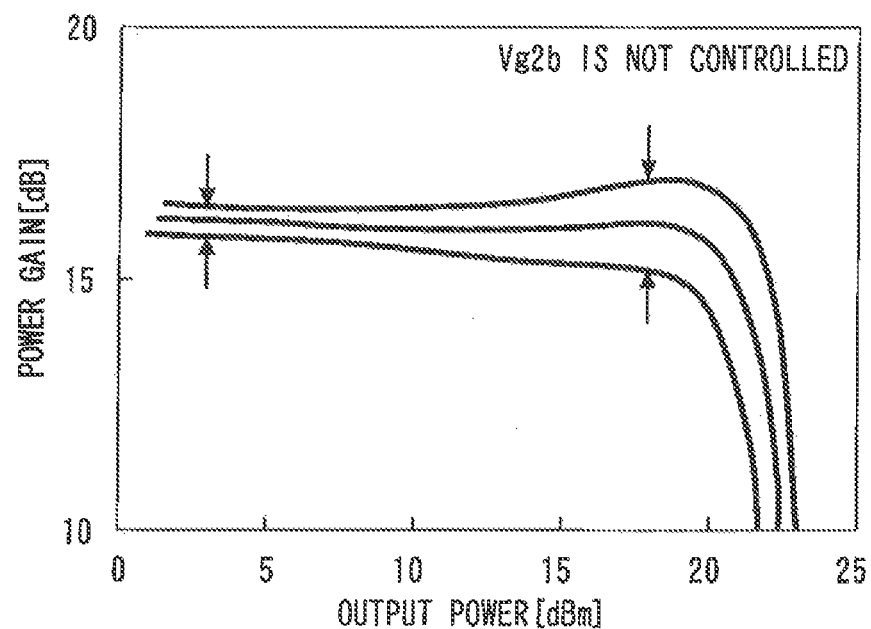
FIGS. 13A and 13B show the relationship between the output power and the power gain of the power amplifier according to the third embodiment of the present invention.
Figure 13B:
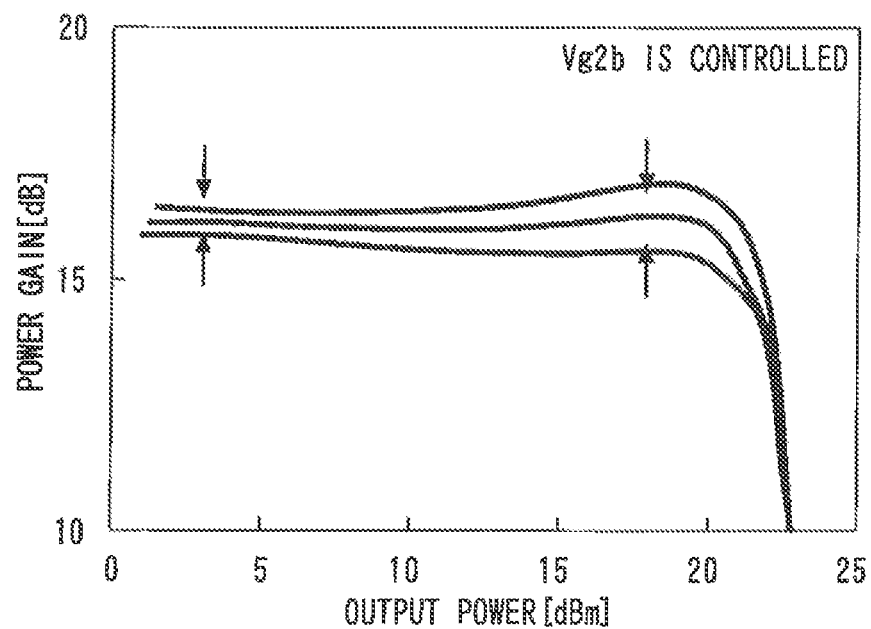

FIGS. 13A and 13B show the relationship between the output power and the power gain of the power amplifier according to the third embodiment of the present invention. FIG. 13A shows the relationship when control of Vd1 through control of the gate voltage Vg5 on Tr5 is not performed. FIG. 13B shows the relationship when control of the gate voltage Vg5 is performed. The power gain deviation at a specified power shown in FIG. 13B is reduced relative to that shown in FIG. 13A. Also, a small-signal gain deviation shown in FIG. 13B is smaller than that shown in FIG. 13A.

Since Tr2 and Tr5 have their sources shorted to one another to have a common source potential, their gate-source voltages Vgs2 and Vgs5 are set to different values depending on the temperature. For example, if the gate voltage Vg5 is supplied from the bias circuit 4 when the temperature is low so that the Vgs5 on Tr5 is Vgs5<<Vth5 (threshold voltage), Tr5 is off and only Tr2 contributes to the amplifying operation. Such temperature control of the gate potential on one of the two gate-grounded transistors enables equivalently changing the number of fingers of the gate-grounded transistors contributing to power amplification. In this case, gain control at the time of saturation is enabled regardless of whether or not the source-grounded transistor has a channel modulation characteristic.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-170973, filed on Aug. 21, 2013, including specification, claims, drawings and summary, on which the Convention priority of the present application is based, is incorporated herein by reference in its entirety.

What is claimed is:

1. A power amplifier comprising:
   a first transistor having a gate, a drain, and a source that is grounded;
   a second transistor having a gate, a drain, and a source that is connected to the drain of the first transistor;
   a capacitor connected between the gate of the second transistor and a grounding point;
   an idling current control circuit having a positive temperature coefficient and making an idling current flowing through the first transistor proportional to ambient temperature of the power amplifier; and
   a drain voltage control circuit having a positive temperature coefficient and making a drain voltage on the first transistor proportional to the ambient temperature.

2. The power amplifier according to claim 1, wherein the drain voltage control circuit supplies a voltage proportional to the ambient temperature to the gate of the second transistor.

3. The power amplifier according to claim 1, wherein the drain voltage control circuit supplies a body voltage proportional to the ambient temperature to a substrate of the second transistor.

4. The power amplifier according to claim 1, wherein the idling current control circuit includes:
   a third transistor having a source that is grounded, and a gate and a drain that are connected to the gate of the first transistor; and
   a current source having a positive temperature coefficient and supplying a current proportional to the ambient temperature to the gate and the drain of the third transistor.

5. A power amplifier comprising:
   a first transistor having a gate, a drain, and a source that is grounded;
   a second transistor having a gate, a drain, and a source that is connected to the drain of the first transistor;
   a third transistor having a gate, a source connected to the drain of the first transistor, and a drain connected to the drain of the second transistor;
   a capacitor connected between the gate of the second transistor and a grounding point;
   an idling current control circuit having a positive temperature coefficient and making an idling current flowing through the first transistor proportional to ambient temperature of the power amplifier; and
   a drain voltage control circuit having a positive temperature coefficient and making a drain voltage on the first transistor proportional to the ambient temperature.

6. The power amplifier according to claim 5, wherein the drain voltage control circuit supplies a voltage proportional to the ambient temperature to the gate of the second transistor.

7. The power amplifier according to claim 5, wherein the idling current control circuit includes:
   a fourth transistor having a source that is grounded, and a gate and a drain that are connected to the gate of the first transistor; and
   a current source having a positive temperature coefficient and supplying a current proportional to the ambient temperature to the gate and the drain of the fourth transistor.

* * * * *